United States Patent
Leung et al.

(10) Patent No.: US 7,820,532 B2
(45) Date of Patent: Oct. 26, 2010

(54) METHODS FOR SIMULTANEOUSLY FORMING DOPED REGIONS HAVING DIFFERENT CONDUCTIVITY-DETERMINING TYPE ELEMENT PROFILES

(75) Inventors: Roger Yu-Kwan Leung, San Jose, CA (US); Nicole Rutherford, Saratoga, CA (US); Anil Bhanap, Milpitas, CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 12/344,748

(22) Filed: Dec. 29, 2008

(65) Prior Publication Data

US 2010/0167511 A1 Jul. 1, 2010

(51) Int. Cl.
*H01L 21/04* (2006.01)
(52) U.S. Cl. .................. 438/510; 438/307; 438/513; 257/E21.077; 257/E21.084; 257/E21.135; 257/E21.141; 257/E21.154; 257/E21.158; 257/E21.324; 257/E21.329
(58) Field of Classification Search .......... 438/510.513, 438/208, 307, 308, 508, 509, 783; 257/E21.077, 257/84, 135, 141, 154, 158, 324, 329
See application file for complete search history.

(56) References Cited

U.S. PATENT DOCUMENTS

| | | | |
|---|---|---|---|
| 4,104,091 A | 8/1978 | Evans, Jr. et al. | |
| 4,478,879 A | 10/1984 | Baraona et al. | |
| 4,891,331 A | 1/1990 | Rapp | |
| 5,008,476 A * | 4/1991 | Manzer et al. | 570/176 |
| 5,071,778 A * | 12/1991 | Solheim | 438/370 |
| 5,302,198 A | 4/1994 | Allman | |
| 5,472,488 A | 12/1995 | Allman | |

(Continued)

FOREIGN PATENT DOCUMENTS

EP 1843389 A1 10/2007

(Continued)

OTHER PUBLICATIONS

A simple processing sequence for selective emitters [Si solarcells]; Horzel, J., Szlufcik, J., Nijs J., Mertens, R., IMEC, Heverlee; Photovoltaic Specialists Conference, 1997, Conference Record of the Twenty-Sixth IEEE; Sep. 29-Oct. 3, 1997; pp. 139-142; Meeting Date: Sep. 29, 1997-Oct. 3, 1997; Location: Anaheim, CA, USA.

(Continued)

*Primary Examiner*—David Nhu
(74) *Attorney, Agent, or Firm*—Ingrassia, Fisher & Lorenz, P.C.

(57) ABSTRACT

Method for simultaneously forming doped regions having different conductivity-determining type elements profiles are provided. In one exemplary embodiment, a method comprises the steps of diffusing first conductivity-determining type elements into a first region of a semiconductor material from a first dopant to form a doped first region. Second conductivity-determining type elements are simultaneously diffused into a second region of the semiconductor material from a second dopant to form a doped second region. The first conductivity-determining type elements are of the same conductivity-determining type as the second conductivity-determining type elements. The doped first region has a dopant profile that is different from a dopant profile of the doped second region.

25 Claims, 5 Drawing Sheets

U.S. PATENT DOCUMENTS

| | | |
|---|---|---|
| 5,527,872 A | 6/1996 | Allman |
| 5,665,845 A | 9/1997 | Allman |
| 6,091,021 A | 7/2000 | Ruby et al. |
| 6,221,719 B1 | 4/2001 | Franco |
| 6,232,207 B1 | 5/2001 | Schindler |
| 6,429,037 B1 | 8/2002 | Wenham et al. |
| 6,632,730 B1 * | 10/2003 | Meier et al. ............ 438/538 |
| 6,664,631 B2 | 12/2003 | Meier et al. |
| 6,695,903 B1 | 2/2004 | Kubelbeck et al. |
| 6,737,340 B2 | 5/2004 | Meier et al. |
| 6,756,290 B1 | 6/2004 | Bultman |
| 6,759,730 B2 * | 7/2004 | Chaudhry et al. .......... 257/586 |
| 6,773,994 B2 | 8/2004 | Chittipeddi |
| 6,784,520 B2 | 8/2004 | Doi |
| 6,825,104 B2 | 11/2004 | Horzel et al. |
| 7,041,549 B2 | 5/2006 | Ootsuka |
| 7,078,324 B2 | 7/2006 | Dudek |
| 7,129,109 B2 | 10/2006 | Munzer et al. |
| 7,183,628 B2 * | 2/2007 | Coolbaugh et al. ......... 257/595 |
| 7,196,018 B2 | 3/2007 | Szlufcik et al. |
| 7,217,883 B2 | 5/2007 | Munzer |
| 7,253,073 B2 * | 8/2007 | Coolbaugh et al. ......... 438/379 |
| 7,537,951 B2 | 5/2009 | Gambino |
| 7,572,740 B2 | 8/2009 | Terry et al. |
| 2002/0153039 A1 | 10/2002 | Moon et al. |
| 2003/0134469 A1 | 7/2003 | Horzel et al. |
| 2004/0063326 A1 | 4/2004 | Szlufcik et al. |
| 2004/0242019 A1 | 12/2004 | Klein et al. |
| 2006/0166429 A1 | 7/2006 | Chaudhry et al. |
| 2006/0237719 A1 | 10/2006 | Colfer et al. |
| 2007/0075416 A1 | 4/2007 | Anderson et al. |
| 2007/0151598 A1 | 7/2007 | De Ceuster et al. |
| 2008/0026550 A1 | 1/2008 | Werner et al. |
| 2008/0076240 A1 | 3/2008 | Veschetti et al. |
| 2008/0314288 A1 | 12/2008 | Biro et al. |
| 2009/0017606 A1 | 1/2009 | Fath et al. |
| 2009/0020156 A1 | 1/2009 | Ohtsuka et al. |
| 2009/0142875 A1 | 6/2009 | Borden et al. |
| 2009/0227097 A1 | 9/2009 | Bateman et al. |
| 2009/0308440 A1 | 12/2009 | Adibi et al. |

FOREIGN PATENT DOCUMENTS

| | | |
|---|---|---|
| EP | 1876651 A1 | 1/2008 |
| JP | 2003168807 | 6/2003 |
| JP | 2003168810 | 6/2003 |
| JP | 2003224285 | 8/2003 |
| JP | 2004221149 | 8/2004 |
| JP | 2005038997 | 2/2005 |
| KR | 10-199-0066346 A | 8/1999 |
| WO | 2007059578 A1 | 5/2007 |
| WO | 2007106502 A2 | 9/2007 |
| WO | 2007118121 A2 | 10/2007 |
| WO | 2009116569 A1 | 9/2009 |
| WO | 2009152378 A1 | 12/2009 |

OTHER PUBLICATIONS

Diffusion Technology Phosphorus Spin-On Dpoants P-8 Series (P-8545, P-854 (2:1), Material Safety Data Sheet, Honeywell International, Apr. 25, 2003, pp. 1-7.

Accuglass P-114A Spin-On Glass, Material Safety Data Sheet, Honeywell International, Oct. 29, 2003, pp. 1-6.

Accuglass P-XXX Spin-On Glass, Material Safety Data Sheet, Honeywell International, May 14, 2003, pp. 1-7.

B-30, B-40, B-50, B-60 Spin-On Dopants, Material Safety Data Sheet, Honeywell International, Apr. 29, 2003, pp. 1-7.

Accuspin Boron; Polymers for All P-Type Diffusion, Honeywell International, 2005, pp. 1-2.

Spin-On Dopants, Thin Film—Dielectrics, Application Comparision, Honeywell International, 2002, pp. 1-2.

Accuglass P-5S, Product Bulletin, Thin-Film Dielectrics, Honeywell International, 2002, pp. 1-2.

Accuglass P-TTY Product Bulletin, Thin-Film Dielectrics, Honeywell International, 2002, pp. 1-2.

Accuglass P-TTY A Series Phosphosilicate Spin-On Glasses, Allied Signal, Inc. Planarization and Diffusion Products, May 1992, pp. 1-2.

Horzel, J., et al., A Simple Processing Sequence for Selective Emitters, Photovaltaic Specialist Conference, Sep. 20-Oct. 3, 1979 pp. 139-142.

* cited by examiner

METHODS FOR SIMULTANEOUSLY FORMING DOPED REGIONS HAVING DIFFERENT CONDUCTIVITY-DETERMINING TYPE ELEMENT PROFILES

FIELD OF THE INVENTION

The present invention generally relates to methods for fabricating semiconductor devices, and more particularly relates to methods for simultaneously forming in a semiconductor material doped regions having different conductivity-determining type element profiles.

BACKGROUND OF THE INVENTION

Doping of semiconductor substrates with conductivity-determining type elements, such as n-type and p-type elements, is used in a variety of applications that require modification of the electrical characteristics of the semiconductor substrates. Photolithography is a well-known method for performing such doping of semiconductor substrates. Photolithography requires the use of a mask that is formed and patterned on the semiconductor substrate. Ion implantation is performed to implant conductivity-determining type ions into the semiconductor substrate in areas corresponding to the mask. A high-temperature anneal then is performed to cause the ions to diffuse into the semiconductor substrate.

In some applications such as, for example, solar cells, it is desirable to dope the semiconductor substrate in a pattern having very fine lines or features. The most common type of solar cell is configured as a large-area p-n junction made from silicon. In one type of such solar cell 10, illustrated in FIG. 1, a silicon wafer 12 having a light-receiving front side 14 and a back side 16 is provided with a basic doping, wherein the basic doping can be of the n-type or of the p-type. The silicon wafer is further doped at one side (in FIG. 1, front side 14) with a dopant of opposite charge of the basic doping, thus forming a p-n junction 18 within the silicon wafer. Photons from light are absorbed by the light-receiving side 14 of the silicon to the p-n junction where charge carriers, i.e., electrons and holes, are separated and conducted to a conductive contact, thus generating electricity. The solar cell is usually provided with metallic contacts 20, 22 on the light-receiving front side as well as on the back side, respectively, to carry away the electric current produced by the solar cell. The metal contacts on the light-receiving front side pose a problem in regard to the degree of efficiency of the solar cell because the metal covering of the front side surface causes shading of the effective area of the solar cell. Although it may be desirable to reduce the metal contacts as much as possible to reduce the shading, a metal covering of approximately 5% remains unavoidable since the metallization has to occur in a manner that keeps the electrical losses small. In addition, contact resistance within the silicon adjacent to the electrical contact increases significantly as the size of the metal contact decreases. However, a reduction of the contact resistance is possible by doping the silicon in narrow areas 24 directly adjacent to the metal contacts on the light-receiving front side 14 with the dopant of opposite charge of the basic doping, thus creating a selective emitter.

The fabrication of a selective emitter, comprising the heavily-doped narrow areas 24 and the relatively lightly-doped areas 26 adjacent to the areas 24, traditionally requires several processing steps. In particular, the fabrication of a selective emitter, or the fabrication of any structure requiring a highly-doped area and a lightly-doped area, typically includes two doping steps and two diffusion steps. However, such methodology is time consuming and costly.

Accordingly, it is desirable to provide methods for forming two different doped regions in a semiconductor material that utilize only one diffusion step and, therefore, are time efficient. In addition, it is desirable to provide methods for fabricating semiconductor devices wherein the methods utilize one diffusion step to achieve two different regions of a semiconductor material having different dopant profiles of elements of the same conductivity-determining type. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A method for fabricating a semiconductor device is provided in accordance with an exemplary embodiment of the present invention. The method comprises the steps of diffusing first conductivity-determining type elements into a first region of a semiconductor material from a first dopant to form a doped first region. Second conductivity-determining type elements are simultaneously diffused into a second region of the semiconductor material from a second dopant to form a doped second region. The first conductivity-determining type elements are of the same conductivity-determining type as the second conductivity-determining type elements. The doped first region has a dopant profile that is different from a dopant profile of the doped second region.

A method for forming doped regions in a semiconductor material is provided in accordance with another exemplary embodiment of the present invention. The method comprises the steps of depositing a first dopant comprising first conductivity-determining type elements overlying a first region of the semiconductor material and depositing a second dopant comprising second conductivity-determining type elements overlying a second region of the semiconductor material. The first dopant is not the second dopant and the second conductivity-determining type elements are of the same conductivity-determining type as the first conductivity-determining type elements. At least a portion of the first conductivity-determining type elements and at least a portion of the second conductivity-determining type elements are simultaneously diffused into the first region and into the second region, respectively.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Methods for simultaneously forming two different doped regions in a semiconductor material are provided. The methods utilize only one diffusion step to form both regions and, therefore, are time efficient. While formed simultaneously, the doped regions have different conductivity-determining type element profiles. In one exemplary embodiment, the doped regions differ by the concentration of the same conductivity-determining type element. In another exemplary embodiment, the doped regions differ by the depth to which the conductivity-determining type elements diffuse. In a further exemplary embodiment, the doped regions may be doped with different conductivity determining type elements, although the elements are of the same conductivity-determining type.

Figure 1:
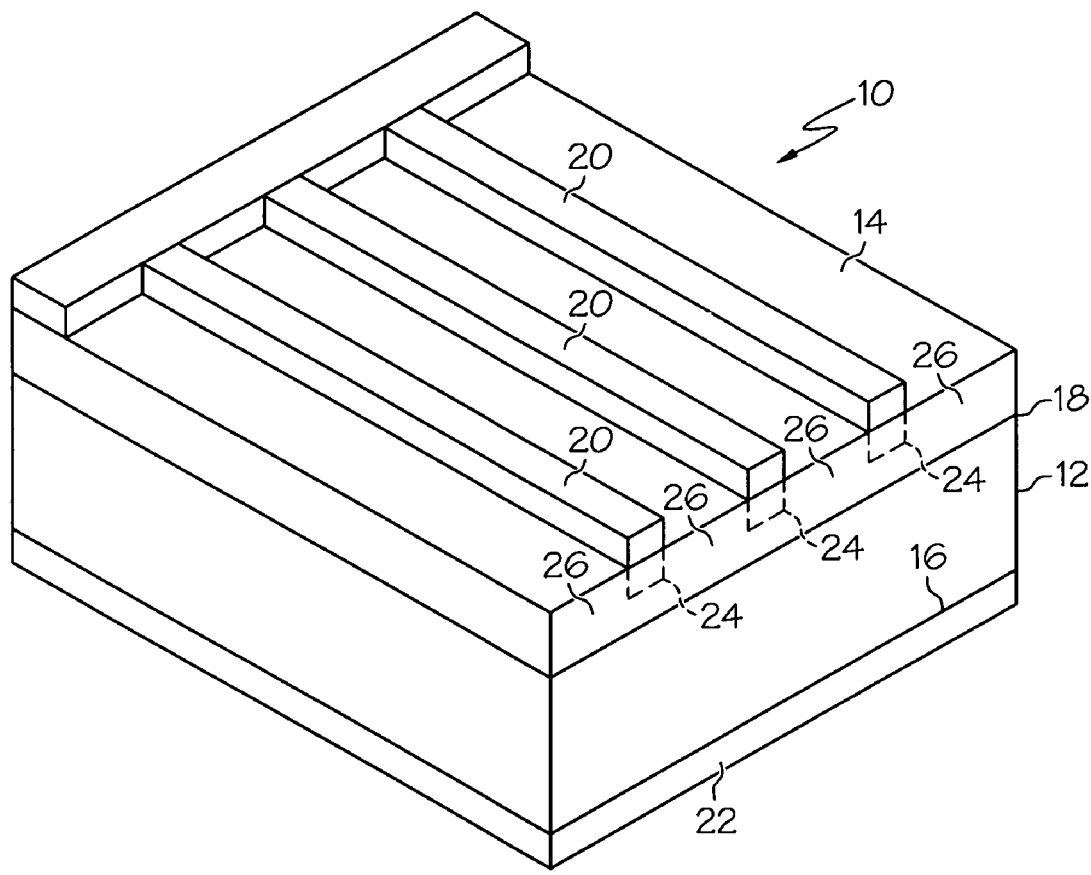
FIG. 1 is a schematic illustration of a conventional solar cell with a light-side contact and a back side contact.
Figure 2:
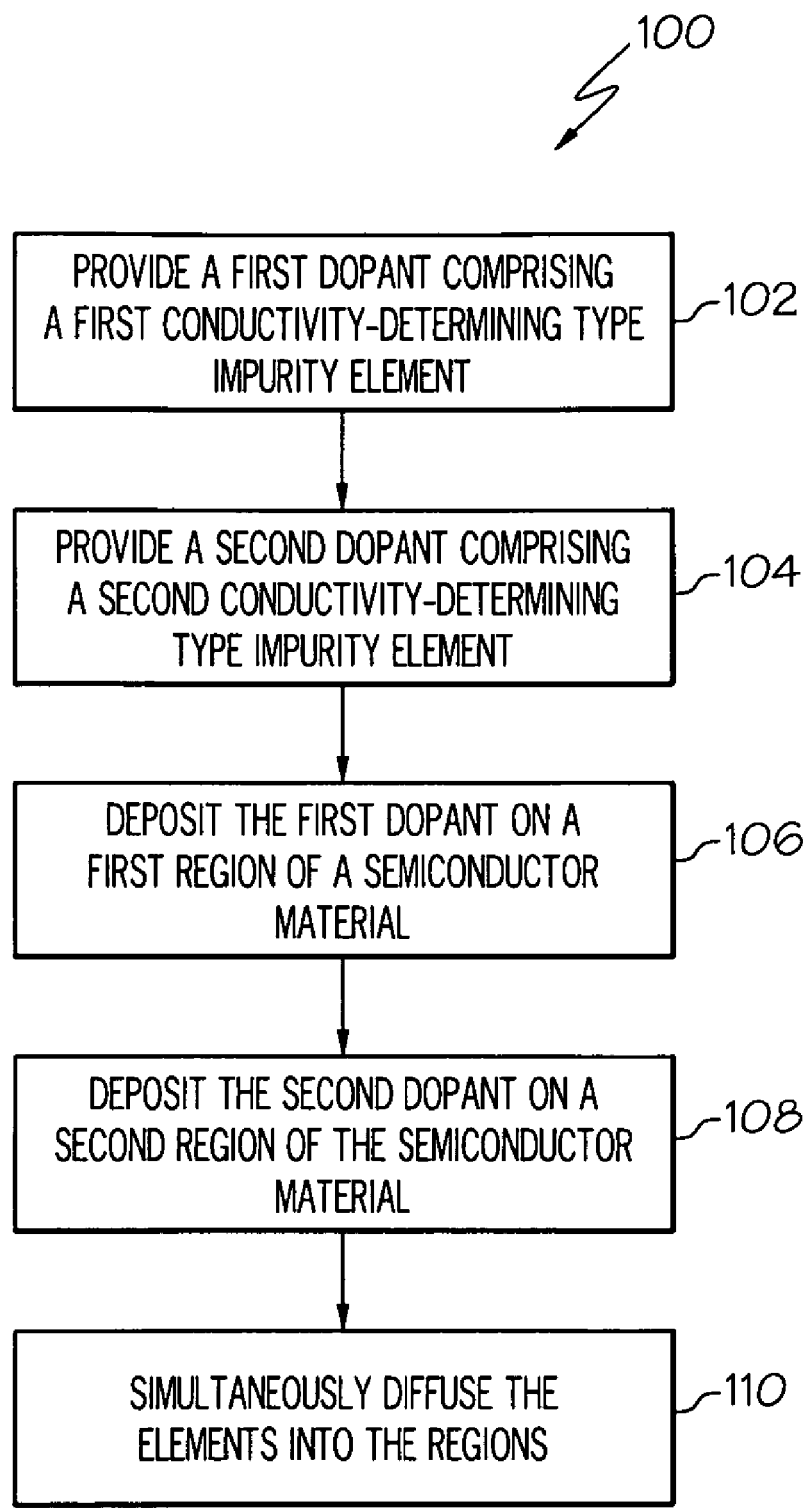
FIG. 2 is a flowchart of a method for simultaneously forming two doped regions having different conductivity-determining type element profiles, in accordance with an exemplary embodiment of the present invention.

FIG. 2 illustrates a method 100 for fabricating a semiconductor device by simultaneously forming two different doped regions in a semiconductor material. As used herein, "semiconductor device" includes any electronic device that comprises a semiconductor material in which doped regions are formed. As used herein, the term "semiconductor material" will be used to encompass monocrystalline silicon materials, including the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other semiconductor materials such as relatively pure and impurity-doped germanium, gallium arsenide, zinc oxide, and the like. The semiconductor material may be a semiconductor substrate or wafer or may comprise any semiconductor material layer overlying a semiconductor substrate or wafer. In this regard, the method 100 can be used to fabricate a variety semiconductor devices including, but not limited to, microelectronics, solar cells and other photovoltaic devices, displays, RFID components, microelectromechanical systems (MEMS) devices, optical devices such as microlenses, medical devices, and the like.

The method 100 includes the step of providing a first dopant comprising first conductivity-determining type elements (step 102). In accordance with an exemplary embodiment of the present invention, the first dopant comprises the appropriate conductivity-determining type impurity elements that are required for the doping. For example, for forming n-type doped regions, the first dopant includes the elements phosphorous, arsenic, antimony, or combinations thereof, in an ionic state, as part of a compound, or as a combination of both. For forming p-type doped regions, the first dopant comprises boron, in an ionic state, as part of a compound, or as a combination of both. The first dopant may comprise any suitable liquid dopant comprising the conductivity-determining type elements. One example of a first dopant includes is a liquid dopant comprising the conductivity-determining type elements combined with a silicate carrier. The terms "silicate" and "silicate carrier" are used herein to encompass silicon- and oxygen-containing compounds including, but not limited to, silicates, including organosilicates, siloxanes, silsesquioxanes, and the like. In one exemplary embodiment, suitable silicate carriers include commercially available silicate carriers such as, for example, USG-50, 103AS, 203AS, T30 and T111, all available from Honeywell International of Morristown, N.J. In another exemplary embodiment, a silicate carrier may be formed by combining at least one hydrolysable silane with at least one hydrogen ion contributor to undergo hydrolysis and polycondensation in a sol-gel reaction to form the silicate carrier. Another example of a first dopant includes a phosphorous-containing acid, such as phosphoric acid and phosphorous acid, or a phosphate such as ammonium phosphate, tetramethylammonium phosphate, tetrabutylammonium phosphate, ammonium phosphate dibasic, ammonium dihydrogen phosphate, and the like, and combinations thereof. The first dopant also may comprise other components or additives such as liquid mediums, pH modifiers, solvents, viscosity modifiers, dispersants, surfactants, polymerization inhibitors, wetting agents, antifoaming agents, detergents and other surface-tension modifiers, flame retardants, pigments, plasticizers, thickeners, rheology modifiers, and mixtures thereof.

The method 100 further includes the step of providing a second dopant comprising second conductivity-determining type elements (step 104), which step can be performed before, during, or after the step of providing the first dopant. The second conductivity-determining type impurity elements are of the same conductivity-determining type as the first conductivity-determining impurity elements. In other words, the first and second conductivity-determining type elements can be both of the n type or both of the p type. In this regard, two different regions of the semiconductor material of the same conductivity-determining type but differing in other respects can be formed. The second dopant may comprise any suitable liquid dopant comprising the conductivity-determining type elements. One example of a second dopant includes a liquid dopant comprising impurity elements combined with a silicate carrier. Another example of a second dopant includes a phosphorous-containing acid, such as phosphoric acid and phosphorous acid, or a phosphate such as ammonium phosphate, tetramethylammonium phosphate, tetrabutylammonium phosphate, ammonium phosphate dibasic, ammonium dihydrogen phosphate, and the like, and combinations thereof. The second dopant also may comprise other components or additives such as liquid mediums, pH modifiers, solvents, viscosity modifiers, dispersants, surfactants, polymerization inhibitors, wetting agents, antifoaming agents, detergents and other surface-tension modifiers, flame retardants, pigments, plasticizers, thickeners, rheology modifiers, and mixtures thereof.

While the first and second dopants comprise conductivity-determining type elements of the same conductivity-determining type, they differ in composition such that two different doped regions of the semiconductor material with different dopant profiles are formed upon heat treatment. In one exemplary embodiment, the first dopant and second dopant comprise the same conductivity-determining type elements but have different concentrations of the elements. In this regard, a first region having a first concentration of the elements and a second region having a higher or lower concentration of the elements can be formed. In another exemplary embodiment, the first dopant and the second dopant comprise conductivity-determining type elements of the same conductivity-determining type but comprise different elements. For example, for forming n-type doped first and second regions, the first dopant may comprise phosphorous while the second dopant may comprise antimony, arsenic, or a combination thereof. In this regard, because the different elements have different diffusion rates in the semiconductor material when subjected to the same annealing conditions, the first region may have a diffusion depth profile different from that of the second region, although diffusion of the elements into the regions occurred at the same time. In a further exemplary embodiment, the first and second dopants comprise different conductivity-determining type elements, liquid mediums, solvents, and/or other additives such that they have different vapor pressures when subjected to the same annealing conditions. In this regard, upon annealing, the first dopant, for example, will vaporize at a faster rate than the second dopant such that less of the conductivity-determining type element of the first dopant is available for diffusion into the first region than is available for diffusion into the second region from the second dopant. Thus, the dopant profiles of the first region and the second region may differ in conductivity-determining type elements, concentration of the elements, and/or diffusion depth profiles. It will be understood that compositions of the first and second dopants also may differ in any other suitable manner that will result in a doped first region and a doped second region having dopant profiles that differ from each other. For example, the first dopant may comprise phosphosilicate and the second dopant may comprise ammonium phosphate, which, upon annealing, will result in dopant profiles having different concentrations and/or depths. In another embodiment, different dopant profiles may be obtained in a semiconductor material by depositing the first dopant at a density greater than or less than a density at which the second dopant is deposited on the semiconductor material.

Method 100 continues in accordance with an exemplary embodiment of the present invention with deposition of the first dopant overlying a first region of the semiconductor material (step 106). The first dopant can be deposited overlying the first region using any suitable non-contact printing process or contact printing process that can achieve localized-doping. As used herein, the term "overlying" encompasses the terms "on" and "over". Accordingly, the first dopant can be applied directly onto the semiconductor material or may be deposited over the semiconductor material such that one or more other materials are interposed between the dopant and the semiconductor material. Examples of materials that may be interposed between the first dopant and the semiconductor material are those materials that do not obstruct diffusion of the dopant into the semiconductor material during annealing. Such materials include silicon nitride or phosphosilicate glass, borosilicate glass, or silicon oxide that forms on a silicon material during formation of P-well regions or N-well regions therein. Typically such materials are removed by deglazing before dopants are deposited on the silicon material; however, in various embodiments, it may be preferable to omit the deglazing process, thereby permitting the materials to remain on the semiconductor material.

Figure 3:
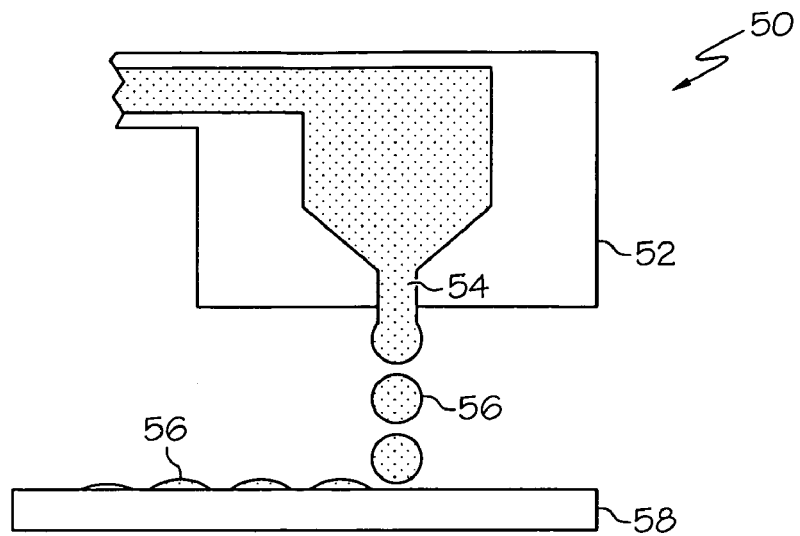
FIG. 3 is a cross-sectional view of an inkjet printer mechanism distributing ink on a substrate.
Figure 4:
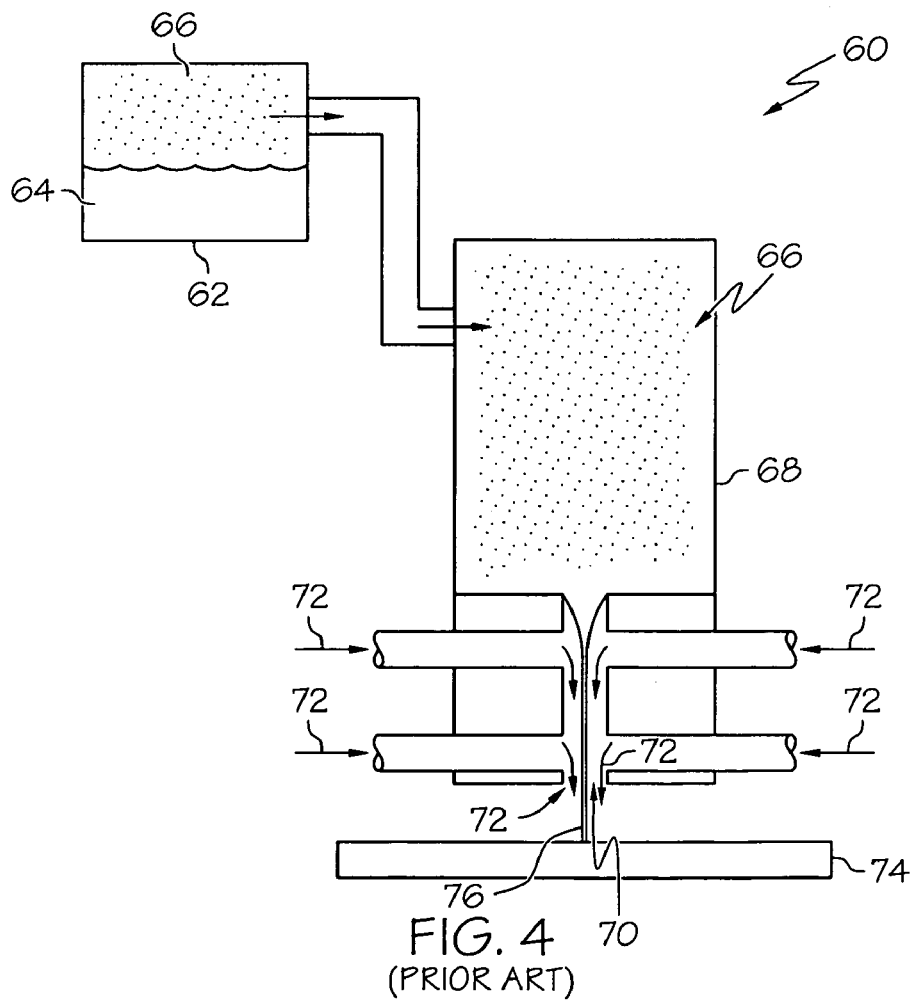
FIG. 4 is a cross-sectional view of an aerosol jet printer mechanism distributing ink on a substrate.

As used herein, the term "non-contact printing process" means a process for depositing a liquid conductivity-determining type dopant selectively on a semiconductor material in a predetermined patterned without the use of a mask, screen, or other such device. Examples of non-contact printing processes include but are not limited to "inkjet printing" and "aerosol jet printing." Typically, the terms "inkjet printing," an "inkjet printing process," "aerosol jet printing," and an "aerosol jet printing process" refer to a non-contact printing process whereby a liquid is projected from a nozzle directly onto a substrate to form a desired pattern. In an inkjet printing mechanism 50 of an inkjet printer, as illustrated in FIG. 3, a print head 52 has several tiny nozzles 54, also called jets. As a substrate 58 moves past the print head 52, or as the print head 52 moves past the substrate, the nozzles spray or "jet" ink 56 onto the substrate in tiny drops, forming images of a desired pattern. In an aerosol jet printing mechanism 60, illustrated in FIG. 4, a mist generator or nebulizer 62 atomizes a liquid 64. The atomized fluid 66 is aerodynamically focused using a flow guidance deposition head 68, which creates an annular flow of sheath gas, indicated by arrow 72, to collimate the atomized fluid 66. The co-axial flow exits the flow guidance head 68 through a nozzle 70 directed at the substrate 74 and focuses a stream 76 of the atomized material to as small as one tenth of the size of the nozzle orifice (typically 100 μm). Patterning is accomplished by attaching the substrate to a computer-controlled platen, or by translating the flow guidance head while the substrate position remains fixed.

Such non-contact printing processes are particularly attractive processes for fabricating doped regions in semiconductor materials for a variety of reasons. First, unlike screen printing or photolithography, only a dopant that is used to form the doped regions touches or contacts the surface of the semiconductor material upon which the dopant is applied. Thus, because the breaking of semiconductor materials could be minimized compared to other known processes, non-contact processes are suitable for a variety of semiconductor materials, including rigid and flexible semiconductor materials. In addition, such non-contact processes are additive processes, meaning that the dopant is applied to the semiconductor materials in the desired pattern. Thus, steps for removing material after the printing process, such as is required in photolithography, are eliminated. Further, because such non-contact processes are additive processes, they are suitable for semiconductor materials having smooth, rough, or textured surfaces. Non-contact processes also permit the formation of very fine features on semiconductor materials. In one embodiment, features, such as, for example, lines, dots, rectangles, circles, or other geometric shapes, having at least one dimension of less than about 200 microns (μm) can be formed. In another exemplary embodiment, features having at least one dimension of less than about 100 μm can be formed. In a preferred embodiment, features having at least one dimension of less than about 20 μm can be formed. In addition, because non-contact processes involve digital computer printers that can be programmed with a selected pattern to be formed on a semiconductor material or that can be provided the pattern from a host computer, no new masks or screens need to be produced when a change in the pattern is desired. All of the above reasons make non-contact printing processes cost-efficient processes for fabricating doped regions in semiconductor materials, allowing for increased throughput compared to screen printing and photolithography.

However, while non-contact printing processes are preferred methods for forming doped regions in a semiconductor material in accordance with certain exemplary embodiments of the present invention, the invention is not so limited and, in other exemplary embodiments, the first dopant can be deposited using other application processes, such as screen printing and roller printing, that can achieve localized doping. Screen printing involves the use of a patterned screen or stencil that is disposed over a semiconductor material. A liquid dopant is placed on top of the screen and is forced through the screen to deposit on the semiconductor material in a pattern that corresponds to the pattern of the screen. Roller printing involves a roller upon which is engraved a pattern. A liquid dopant is applied to the engraved pattern of the roller, which is pressed against a semiconductor material and rolled across the semiconductor material, thereby transferring the liquid dopant to the semiconductor material according to the pattern on the roller.

Referring again to FIG. 2, the first dopant is deposited overlying a first region of the semiconductor material according to a pattern that is stored in or otherwise supplied to an inkjet printer or an aerosol jet printer or that is encompassed or reflected in a screen, roller, or other template. An example of inkjet printers suitable for use includes, but is not limited to, Dimatix Inkjet Printer Model DMP 2811 available from Fujifilm Dimatix, Inc. of Santa Clara, Calif. An example of an aerosol jet printer suitable for use includes, but is not limited to, an M3D Aerosol Jet Deposition System available from Optomec, Inc. of Albuquerque, N. Mex. Preferably, the first dopant is applied to the semiconductor material at a temperature in the range of about 15° C. to about 80° C. in a humidity of about 20 to about 80%.

Figure 5:
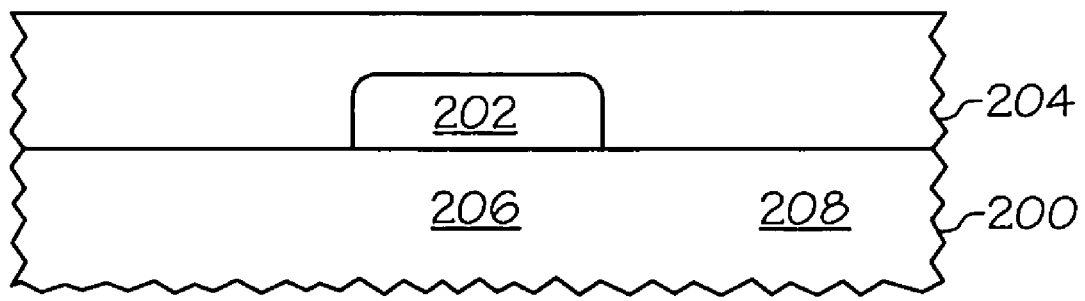
FIG. 5 is a schematic cross-sectional view of a second dopant overlying a first dopant disposed overlying a semiconductor material, in accordance with an exemplary embodiment of the present invention.

After deposition of the first dopant, the second dopant is deposited overlying a second region of the semiconductor material (step 108). In one exemplary embodiment, as illustrated in FIG. 5, the second dopant 204 is deposited to overlie a second region 208 of the semiconductor material 200 and at least partially overlie the first dopant 202 overlying a first region 206 of the semiconductor material 204. In this regard, the second dopant can be spun onto semiconductor material by spinning the semiconductor material at a spin speed of up to 1200 revolutions per minute or even higher while spraying the second dopant onto the spinning semiconductor material at a desired fluid pressure. Spinning of the semiconductor material causes the second dopant to spread outward substantially evenly across the semiconductor material. The second dopant alternatively can be sprayed onto an unmoving semiconductor material at a desired fluid pressure at a position substantially at the center of the material. The fluid pressure causes the second dopant to spread radially and substantially evenly across the semiconductor material. The second dopant also can be deposited by a non-contact printing process such as by inject printing or aerosol jet printing. Accordingly, different nozzle sizes can be used for printing the first and second dopants, depending on the line widths desired. In another embodiment, a drop spacing different from the drop spacing used to deposit the first dopant can also be used to deposit the second dopant such that the first and second dopants are deposited with different densities. The second dopant also may be applied by screen printing or roller printing.

Figure 6:
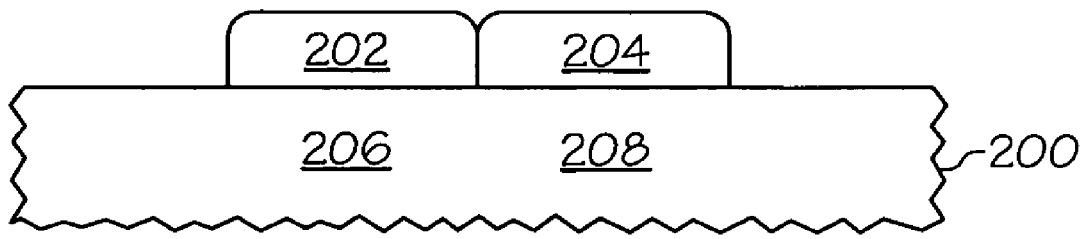
FIG. 6 is a schematic cross-sectional view of a first dopant overlying a first region of a semiconductor material and a second dopant overlying a second region of the semiconductor material, wherein the first region and second region are substantially mutually exclusive, in accordance with an exemplary embodiment of the present invention.

In another exemplary embodiment of the present invention, the first dopant 202 is deposited by a printing process on a first region 206 of the semiconductor material 200 and the second dopant then is deposited, also by a printing process, on a second region 208 of the semiconductor material, as illustrated in FIG. 6. In one exemplary embodiment, the second region is substantially exclusive of the first region. However, it will be appreciated that the invention is not so limited and that partial or complete overlapping of the second dopant onto the first dopant is contemplated herein. In one exemplary embodiment, such as during the fabrication of a selective emitter of a solar cell, the second dopant is deposited adjacent or proximate to the first dopant so that heavily-doped narrow areas are formed adjacent or proximate to relatively lightly-doped areas. In another embodiment, a drop spacing different from the drop spacing used to deposit the first dopant can be used to deposit the second dopant such that the first and second dopants are deposited with different densities. It will be understood that the first dopant and the second dopant also can be applied to the first region and second region, respectively, in any suitable order using any of the above-described application techniques or other suitable techniques to fabricated doped regions for a desired device application.

Returning to FIG. 2, once the first dopant and the second dopant are deposited overlying the semiconductor material, regardless of the method and the order of deposition, the conductivity-determining type elements are caused to diffuse from the dopants into the first region and the second region, respectively, of the semiconductor material (step 110). The diffusion may be effected, for example, by subjecting the semiconductor material to a high-temperature thermal treatment or "anneal" to cause the conductivity-determining type elements, in an ionic state or otherwise, of the dopants to diffuse into the semiconductor material, thus forming two regions within the semiconductor material having different dopant profiles. The time duration and the temperature of the anneal is determined by such factors as the initial dopant concentrations of the first dopant and/or the second dopant, the thickness of the dopant deposits, the desired concentration of the resulting first and/or second regions, and the depth to which the conductivity-determining type elements are to diffuse. The anneal can be performed using any suitable heat-generating method, such as, for example, thermal annealing, infrared heating, laser heating, microwave heating, a combination thereof, and the like. In one exemplary embodiment of the present invention, the semiconductor material is placed inside an oven wherein the temperature is ramped up to a temperature in the range of about 850° C. to about 1100° C. and the substrate remains at this temperature for about 2 to about 90 minutes. Annealing also may be carried out in an in-line furnace to increase throughput. The annealing atmosphere may contain 0 to 100% oxygen in an oxygen, oxygen/nitrogen, or oxygen/argon mixture. In a preferred embodiment, the substrate is subjected to an anneal temperature in the range of from about 850° C. to about 950° C. for about thirty (30) minutes in an oxygen-free ambient.

As noted above, upon annealing, the first region and the second region of the semiconductor material are doped with conductivity-determining type elements of the same conductivity-determining type such that the regions have different dopant profiles. In one embodiment, the regions are doped with the same conductivity-determining type elements but one region has a higher concentration of the conductivity-determining type elements than the other region. In another embodiment, the regions are doped with the same elements but the depth to which the elements diffused is different. In yet another embodiment, the regions are doped with different conductivity-determining type elements having substantially the same or different concentrations and/or having the same or different diffusion depth profiles.

The following is an example of a method for fabricating doped regions of semiconductor substrates in accordance with an exemplary embodiment of the present invention. The example is provided for illustration purposes only and is not meant to limit the various embodiments of the present invention in any way.

EXAMPLE

Synthesis of a First Phosphorous Dopant

In a 500 milliliter (ml) flask, 12.81 grams (gm) of 85% high purity phosphoric acid was added to 107.73 gm of 2-propanol. 23.89 gm of tetraethoxysilane (TEOS) was added to the flask, followed by 19.42 gm of acetic anhydride and 1.44 gm deionized (D.I.) water. The solution was stirred with a magnetic stir bar for about 5 minutes. The solution was heated to reflux in a heating mantle with stirring. After reflux for 3 hours, heat was removed from the solution, which was cooled to room temperature.

Approximately 25.59 gm of the solution was combined with 2.91 gm of acetoxytrimethylsilane. The mixture was stirred for 5 minutes and was then left at room temperature for 18 hours. To this solution, 1.38 gm of 99+% tetrabutylammonium acetate (TBAA) was added. The solution was stirred by a magnetic bar until the solid TBAA was dissolved. 0.12 gm of 20% L19330 surfactant solution then was added to form the first phosphorous dopant. L19330 surfactant is available from 3M Company of St. Paul, Minn. The solution was then filtered using a 0.2 micron Teflon filter. The first phosphorous dopant comprised about 1.78 wt % phosphorous.

Printing Using First Phosphorous Dopant

Figure 7:
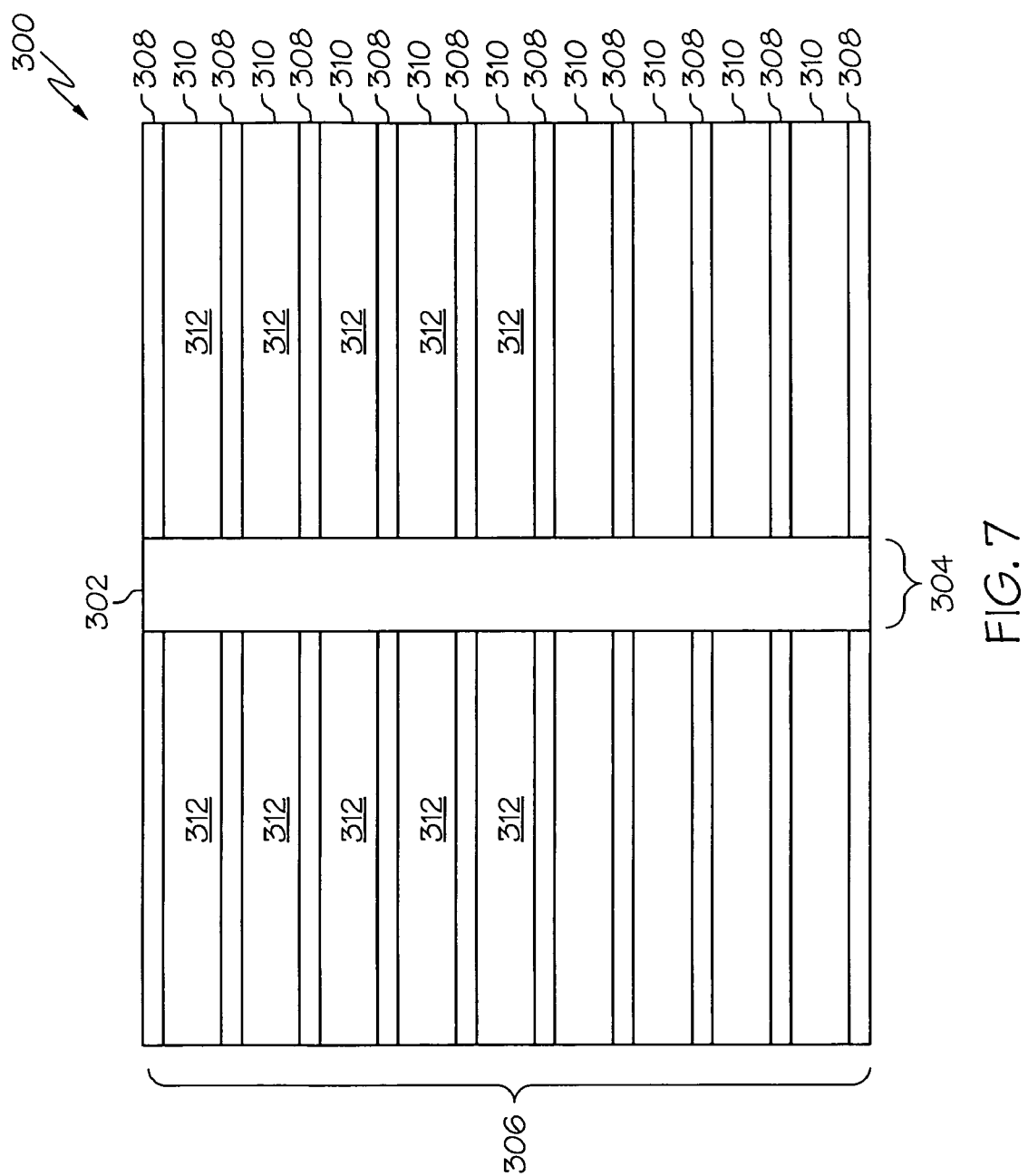
FIG. 7 is a schematic top-view illustration of an array printed using different phosphorous dopant densities and phosphorous dopants having different concentrations of phosphorous.

A Fujifilm Dimatix Inkjet Printer Model DMP 2811 with a 21 micron (μm) (10 picoliter (pL)) nozzle was used for printing patterns of the first phosphorous dopant on two 4-inch silicon wafers. The stage temperature of the printer was room temperature (i.e., approximately 21° C.) and the jetting frequency was 2 kilohertz (kHz). As illustrated in FIG. 7, using a printing drop spacing of 30 μm, that is, using a spacing of 30 μm between the centers of adjacent drops, an array 300 of eleven parallel horizontal lines 308 with dimensions of about 0.6 mm width and 60 mm length and one vertical rectangle 302 with dimensions of 6.0 mm width in the horizontal direction, indicated by double-headed arrow 304, and 66.6 mm length in the vertical direction, indicated by double-headed arrow 306, was printed on both wafers. The vertical rectangle 302 was printed in the center of the horizontal lines 308 such that the top of the vertical rectangle started from the first horizontal line and terminated at the eleventh horizontal line. The left side of the vertical rectangle 302 was 27 mm from the left side of the array and the right side of the vertical rectangle was 33 mm from the left side of the array. Accordingly, 20 horizontal non-print areas 310 with dimensions of 27 mm length and 6 mm width were disposed between the horizontal lines 308. Next, at a printing drop spacing of 50 μm, the upper half 312 of the 20 non-print areas were printed with the same dopant.

Without baking, the first wafer was heated to 950° C. and held at that temperature for about 30 minutes in an atmosphere of 10% oxygen and 90% nitrogen. The second wafer was baked at 250° C. for 3 minutes and then heated to 950° C. and held at that temperature for about 30 minutes in an atmosphere of 100% nitrogen.

Using a 4-point probe, the average sheet resistances Rs (ohm/square) of vertical rectangle 302 printed with a drop spacing of 30 μm, non-printed areas 310, and areas 312 printed with a drop spacing of 50 μm for both wafers were measured. The results are provided in Table 1:

TABLE 1

| Wafer No. | Diffusion Temp/ Time | Diffusion Atmosphere | Rs of Vertical Rectangle 302 (30 μm drop spacing) | Rs of Non-Print Areas 310 | Rs of Printed Areas 312 (50 μm drop spacing) |
|---|---|---|---|---|---|
| 1 | 950° C./ 30 min | 10% $O_2$; 90% $N_2$ | 49 ± 14 | 1278 ± 182 | 117 ± 30 |
| 2 | 950° C./ 30 min | 100% $N_2$ | 14 ± 1 | 60 ± 4 | 23 ± 2 |

Accordingly, the results demonstrate that the average sheet resistance of the silicon areas upon which the higher density of the first phosphorous dopant was deposited (i.e., 30 μm drop spacing deposition) is less than the sheet resistance of those silicon areas upon which the lower density of the first phosphorous dopant was deposited. The sheet resistances of the non-printed areas are a result of doping of the areas by phosphorous that out-diffused from the dopant on the printed areas.

Synthesis of a Second Phosphorous Dopant 5.05 gm of the first phosphorous dopant was mixed with 10.2 gm isopropyl alcohol. The solution then was filtered using a 0.45 μm Teflon filter to form a second phosphorous dopant. The second phosphorous dopant comprised about 0.59 wt % phosphorous.

Printing Using Second Phosphorous Dopant

The printer and printing procedure described above was used to print the same array configuration as illustrated in FIG. 7 on a third 4-inch silicon wafer. The first phosphorous dopant used above was deposited on the third wafer using a drop spacing of 30 μm to form the vertical rectangle 302 having a 6 mm horizontal width and a 66.6 mm vertical length. Using the same drop spacing, the second phosphorous dopant was deposited on the upper half 312 of the non-printed areas 310. Without baking, the third wafer was heated to 950° C. and held at that temperature for about 30 minutes in an atmosphere of 10% oxygen and 90% nitrogen.

Using a 4-point probe, the average sheet resistances Rs (ohm/square) of vertical rectangle 302 printed with the first phosphorous dopant, non-printed areas 310, and areas 312 printed with the second phosphorous dopant were measured. The results are provided in Table 2:

TABLE 2

| Wafer No. | Diffusion Temp/ Time | Diffusion Atmosphere | Rs of Vertical Rectangle 302 (first dopant) | Rs of Non-Print Areas 310 | Rs of Printed Areas 312 (second dopant) |
|---|---|---|---|---|---|
| 3 | 950° C./ 30 min | 10% $O_2$; 90% $N_2$ | 27 ± 11 | 1024 ± 47 | 98 ± 17 |

As illustrated in Table 2, although both the first phosphorous dopant and the second phosphorous dopant were deposited on the respective areas using the same dopant density (i.e., 30 μm drop spacing), the high sheet resistance of the silicon areas upon which the second phosphorous dopant was deposited was due to the lower concentration of the phosphorous in the second phosphorous dopant.

Accordingly, methods for simultaneously forming two different doped regions in a semiconductor material are provided. The methods utilize only one diffusion step to form both regions and, therefore, are time efficient. In addition, in various embodiments, the methods utilize two different dopants that vary in composition so that the resulting doped regions have conductivity-determining type element profiles that differ in concentration, in conductivity-determining type element, in diffusion depth, and the like. Further, in other embodiments, the methods utilize dopants printed or deposited on the semiconductor material with different densities so that the resulting doped regions have different conductivity-determining type element profiles. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a semiconductor device, the method comprising the steps of:
    diffusing first conductivity-determining type elements into a first region of a semiconductor material from a first liquid dopant to form a doped first region; and
    simultaneously diffusing second conductivity-determining type elements into a second region of the semiconductor material from a second liquid dopant to form a doped second region, wherein the first conductivity-determining type elements are of the same conductivity-determining type as the second conductivity-determining type elements;
    wherein, the doped first region has a dopant profile that is different from a dopant profile of the doped second region.

2. The method of claim 1, wherein the step of simultaneously diffusing comprises simultaneously diffusing second conductivity-determining type elements that are different from the first conductivity-determining type elements.

3. The method of claim 1, wherein the step of simultaneously diffusing comprises simultaneously diffusing second conductivity-determining type elements from the second liquid dopant that has a concentration of the second conductivity-determining type elements that is different from a concentration of the first conductivity-determining type elements of the first liquid dopant.

4. The method of claim 1, wherein the step of diffusing comprises diffusing first conductivity-determining type elements into the first region to form a doped first region having a first conductivity-determining type elements diffusion profile and wherein the step of simultaneously diffusing comprises simultaneously diffusing second conductivity-determining type elements into a second region to form a doped second region having a second conductivity-determining type elements diffusion profile that is different from the first conductivity-determining type elements diffusion profile.

5. The method of claim 1, wherein the step of diffusing comprises diffusing first conductivity-determining type elements from the first liquid dopant having a first vapor pressure and wherein the step of simultaneously diffusing comprises simultaneously diffusing second conductivity-determining elements from the second liquid dopant having a second vapor pressure that is different from the first vapor pressure.

6. The method of claim 1, wherein the step of diffusing comprises diffusing first conductivity-determining type elements into the first region to form a doped first region having a first conductivity-determining type elements concentration and wherein the step of simultaneously diffusing comprises simultaneously diffusing second conductivity-determining type elements into a second region to form a doped second region having a second conductivity-determining type elements concentration that is different from the first conductivity-determining type elements concentration.

7. The method of claim 1, wherein the step of diffusing comprises the step of depositing the first liquid dopant overlying the first region and wherein the step of simultaneously diffusing comprises depositing the second liquid dopant overlying the second region, wherein the second liquid dopant is deposited overlying the first liquid dopant.

8. The method of claim 7, wherein the step of depositing the first liquid dopant is performed using inkjet printing, aerosol jet printing, screen printing or roller printing.

9. The method of claim 7, wherein the step of depositing the second liquid dopant is performed by spinning, inkjet printing, aerosol printing, screen printing, roller printing, or spraying the second liquid dopant overlying the second region.

10. The method of claim 1, wherein the step of diffusing comprises the step of depositing the first liquid dopant overlying the first region and wherein the step of simultaneously diffusing comprises depositing the second liquid dopant overlying the second region, wherein the second region is substantially exclusive of the first region.

11. The method of claim 10, wherein the step of depositing the first liquid dopant is performed using inkjet printing, aerosol jet printing, screen printing or roller printing.

12. The method of claim 10, wherein the step of depositing the second liquid dopant is performed using inkjet printing, aerosol jet printing, screen printing or roller printing.

13. The method of claim 1, further comprising the steps of depositing the first liquid dopant onto the semiconductor material such that it has a first density and depositing the second liquid dopant onto the semiconductor material such that it has a second density that is different from the first density.

14. A method for forming doped regions in a semiconductor material, the method comprising the steps of:
    depositing a first liquid dopant comprising first conductivity-determining type elements overlying a first region of the semiconductor material;
    depositing a second liquid dopant comprising second conductivity-determining type elements overlying a second region of the semiconductor material, wherein the first liquid dopant is not the second liquid dopant and wherein the second conductivity-determining type elements are of the same conductivity-determining type as the first conductivity-determining type elements;
    simultaneously diffusing at least a portion of the first conductivity-determining type elements into the first region and at least a portion of the second conductivity-determining type elements into the second region.

15. The method of claim 14, wherein the step of depositing a second liquid dopant comprises depositing the second liquid dopant having a concentration of second conductivity-determining type elements that is different from a concentration of first conductivity-determining type elements of the first liquid dopant.

16. The method of claim 14, wherein the step of depositing a second liquid dopant comprises depositing the second liquid dopant having a vapor pressure that is different from a vapor pressure of the first liquid dopant.

17. The method of claim 14, wherein the step of depositing a second liquid dopant comprises depositing the second liquid dopant having second conductivity-determining type elements that are different from the first conductivity-determining type elements of the first liquid dopant.

18. The method of claim 14, wherein the step of depositing a second liquid dopant comprises depositing the second liquid dopant having a composition that is different from a composition of the first liquid dopant.

19. The method of claim 14, wherein the step of depositing a second liquid dopant comprises depositing the second liquid dopant overlying the first liquid dopant.

20. The method of claim 19, wherein the step of depositing the first liquid dopant is performed using inkjet printing, aerosol jet printing, screen printing or roller printing.

21. The method of claim 19, wherein the step of depositing the second liquid dopant is performed by spinning, inkjet printing, aerosol jet printing, screen printing, roller printing, or spraying the second liquid dopant overlying the second region.

22. The method of claim 14, wherein the step of depositing a second liquid dopant overlying the second region comprises depositing the second liquid dopant such that the second region is substantially exclusive of the first region.

23. The method of claim 22, wherein the step of depositing the first liquid dopant is performed using inkjet printing, aerosol jet printing, screen printing or roller printing.

24. The method of claim 22, wherein the step of depositing the second liquid dopant is performed using inkjet printing, aerosol jet printing, screen printing or roller printing.

25. The method of claim 14, wherein the steps of simultaneously diffusing is performed by thermal annealing, infrared annealing, laser annealing, microwave annealing, or a combination thereof.

* * * * *